(12) United States Patent
Unno

(10) Patent No.: US 6,360,293 B1
(45) Date of Patent: Mar. 19, 2002

(54) SOLID STATE DISK SYSTEM HAVING ELECTRICALLY ERASABLE AND PROGRAMMABLE READ ONLY MEMORY

(75) Inventor: Yusaku Unno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/339,206

(22) Filed: Jun. 24, 1999

(30) Foreign Application Priority Data

Jun. 24, 1998 (JP) .......................................... 10-177083

(51) Int. Cl.$^7$ .............................................. G06F 12/00
(52) U.S. Cl. ...................................................... 711/103
(58) Field of Search ............................... 711/103; 714/2, 714/6, 7

(56) References Cited

U.S. PATENT DOCUMENTS

| | | | |
|---|---|---|---|
| 5,297,148 A | | 3/1994 | Harari et al. |
| 5,406,529 A | * | 4/1995 | Asano ........................ 365/230 |
| 5,418,752 A | | 5/1995 | Harari et al. |
| 5,438,573 A | | 8/1995 | Mangan et al. |
| 5,602,987 A | | 2/1997 | Harari et al. |
| 5,841,699 A | * | 11/1998 | Miyauchi ............... 368/185.33 |
| 5,875,477 A | * | 2/1999 | Hasbun ..................... 711/162 |
| 6,081,447 A | * | 6/2000 | Lofgren ................. 365/185.02 |
| 6,161,199 A | * | 12/2000 | Szeto ........................... 714/30 |

* cited by examiner

Primary Examiner—Matthew M. Kim
Assistant Examiner—C. P. Chace
(74) Attorney, Agent, or Firm—Venable; Michael A. Sartori; Jeffrey W. Gluck

(57) ABSTRACT

A solid state disk system having an electrically erasable and programmable read only memory is disclosed. The solid state disk system comprises a host interface for inputting data from and outputting data to a host computer located outside of said solid state disk system, a buffer memory coupled to the host interface for temporally storing data, an EEPROM coupled to the buffer memory, a micro-controller coupled to the host interface and buffer memory for controlling a replacement procedure. The EEPROM has a memory region divided into a plurality of blocks each of which is erased at the same time. The memory region has a user block region storing data accessed from the host computer, a spare block region storing data from the outside for replacing any defective block within the user block region, and a replacement information region storing information about an address of a spare block corresponding to the defective block. The solid state disk system further comprises a header controller coupled to the micro-controller and EEPROM for writing a same information whether the block is defective in each header portion of sectors of the user block region.

13 Claims, 7 Drawing Sheets

| SPARE ADDRESS | SPARE ADDRESS | SPARE ADDRESS |
|---|---|---|
| 542a | 542b | 542c |

FIG. 4

| CHIP NUMBER | SPARE ADDRESS | CHIP NUMBER | SPARE ADDRESS |
|---|---|---|---|
| 247a | 242a | 247b | 242b |

SOLID STATE DISK SYSTEM HAVING ELECTRICALLY ERASABLE AND PROGRAMMABLE READ ONLY MEMORY

BACKGROUND OF THE INVENTION

This invention relates to a solid state disk system, and especially a solid state disk system having a non-volatile electrically erasable and programmable read only memory which has blocks erased at the same time.

Traditional low cost mass computer storage systems have used a mechanical device employing magnetic storage media, such as a hard disk drive. The hard disk drive has predetermined memory blocks, each including a number of sectors. A disk surface of the hard disk drive is mechanically damaged sometimes during a manufacturing stage and installation in the computer system. Where the damaged disk surface is out of the scope of the permitted level, it is treated as a defect inhibiting data read and data write operations. The predetermined numbers of memory blocks of the memory system should be operated as a non-defective blocks even if there is such defect. Therefore, a non-defective spare block is assigned as a substitute for the defective block. This treatment is called a replacement. Information of the defective block (hereinafter "replacement information") should be stored and used during the replacement.

The replacement information includes information of a presence of the defect and an address of the replaced spare block. The replacement information is stored in memory media such as a RAM (Random Access Memory) controlled by a CPU (Central Processing Unit) of a micro-controller. In the case of the replacement information being stored in the RAM, a memory region for storing the replacement information is ensured in the hard disk drive or a back up electric power source for the RAM is required. Further, the replacement information should include information recorded during the manufacturing stage of the hard disk drive as well as replacement information newly found in an operation of the hard disk drive which should be additionally recorded. However, the additionally recorded information cannot be stored in the RAM.

Instead of the RAM, a non-volatile electrically rewritable memory such as a flash EEPROM is used for storing the replacement information. In such case, the flash EEPROM has a memory region divided into a number of blocks, each of which is erased at the same time. The memory region of the flash EEPROM includes a user block region storing user data, a spare block region having a spare block storing data of the defective block of the user block region, and a replacement information region storing information about an address of the spare block corresponding to the defective block where the defective block is present. Each one of the blocks in the user block region is comprised of a number of sectors, such as 16 sectors. Each of the sectors includes a header portion and a data portion. The header portion stores a code indicating a validity of the sector and a number of rewriting. The data portion stores data accessed from a host computer.

Where the header portion of the solid state disk system employing the EEPROM is defective or has an error, a normal access from the host computer cannot be ensured. In order to evade such error, an error checking and correction (ECC) region is exclusively ensured in the header portion. However, the ECC region makes the hardware larger. Further, where the replacement information region of the solid state disk system employing the EEPROM is defective or has an error, a normal access from the host computer cannot be ensured, either.

SUMMARY OF THE INVENTION

With the foregoing in view, it is therefore an object of the present invention to provide a solid state disk system being capable of access from the host computer where the header portion is defective.

For achieving the above object, a solid state disk system comprises a host interface for inputting data from and outputting data to a host computer located outside of said solid state disk system, a buffer memory coupled to the host interface for temporally storing data, an EEPROM coupled to the buffer memory, a micro-controller coupled to the host interface and buffer memory for controlling a replacement procedure. The EEPROM has a memory region divided into a plurality of blocks, each of which is erased at the same time. The memory region has a user block region storing data accessed from the host computer, a spare block region storing data from the outside for replacing any defective block within the user block region, and a replacement information region storing information about an address of a spare block corresponding to the defective block. The solid state disk system further comprises a header controller coupled to the micro-controller and EEPROM for writing a same information whether the block is defective in each header portion of sectors of the user block region.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4 is a block diagram showing an image of the replacement information region of the EEPROM shown in FIG. 1;

FIG. 6 is a block diagram showing an image of the replacement information region of the EEPROM shown in FIG. 5;

DETAILED DESCRIPTION OF THE PREFERRED EMBODIMENTS

Figure 1:
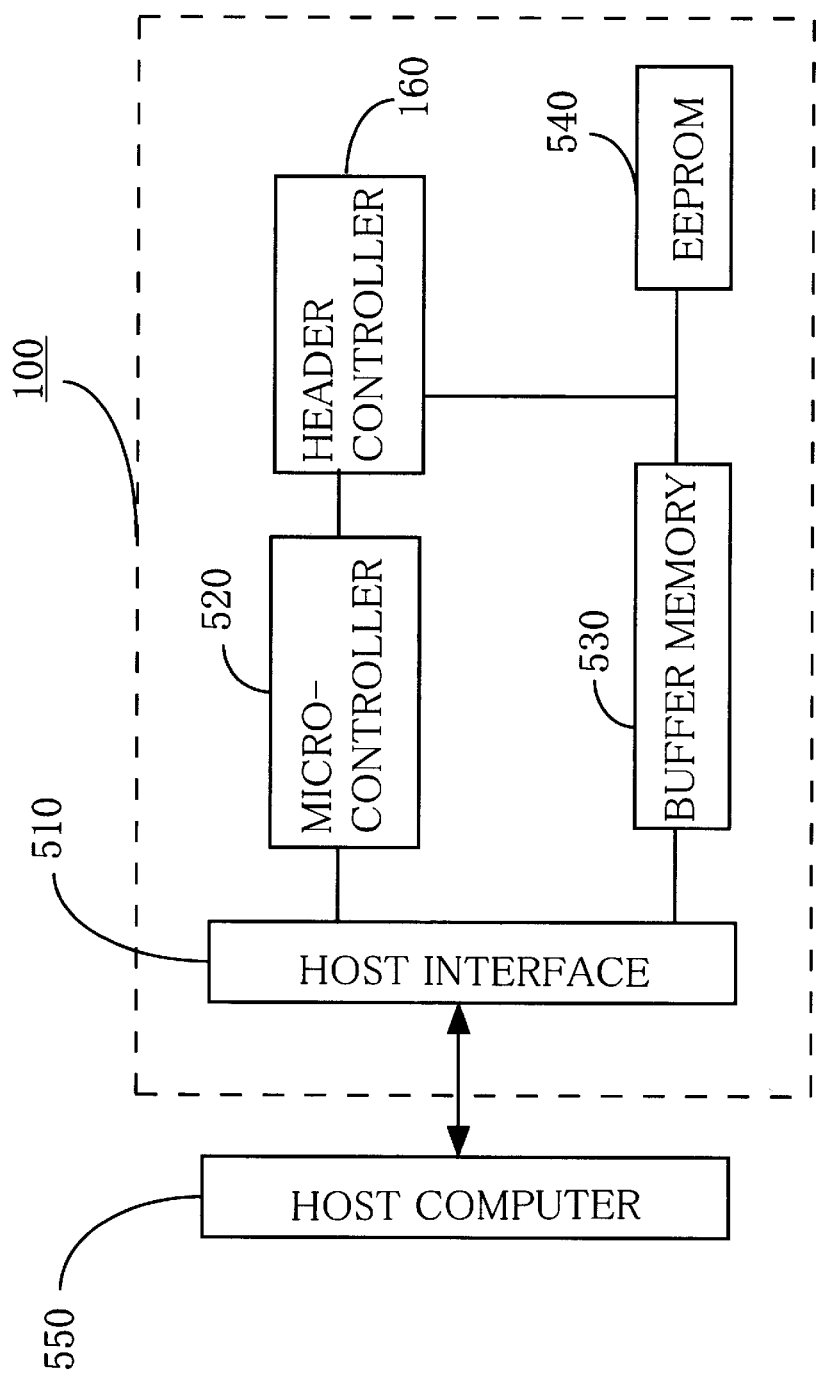
FIG. 1 is a block diagram showing a solid state disk system according to a first embodiment of the present invention.

Preferred embodiments of the present invention will hereinafter be described in detail with reference to the accompanying drawings. FIG. 1 shows a solid state disk system 100 according to a first embodiment of the present invention. The solid state disk system 100 has a host interface 510 for inputting data from and outputting data to a host computer 550 which is located outside of the solid state disk system 100 and a micro-controller 520 for checking a defective block and conducting a replacement treatment and a replacement treatment control which will be discussed below. The solid state disk system 100 further includes a buffer memory 530 for temporally storing data and an EEPROM 540 divided into blocks, each of which is erased at the same time. The solid state disk system 100 has a header controller 160 coupled to the micro-controller 520 and EEPROM 540. The header controller 160 will be discussed below.

Figures 2, 3:
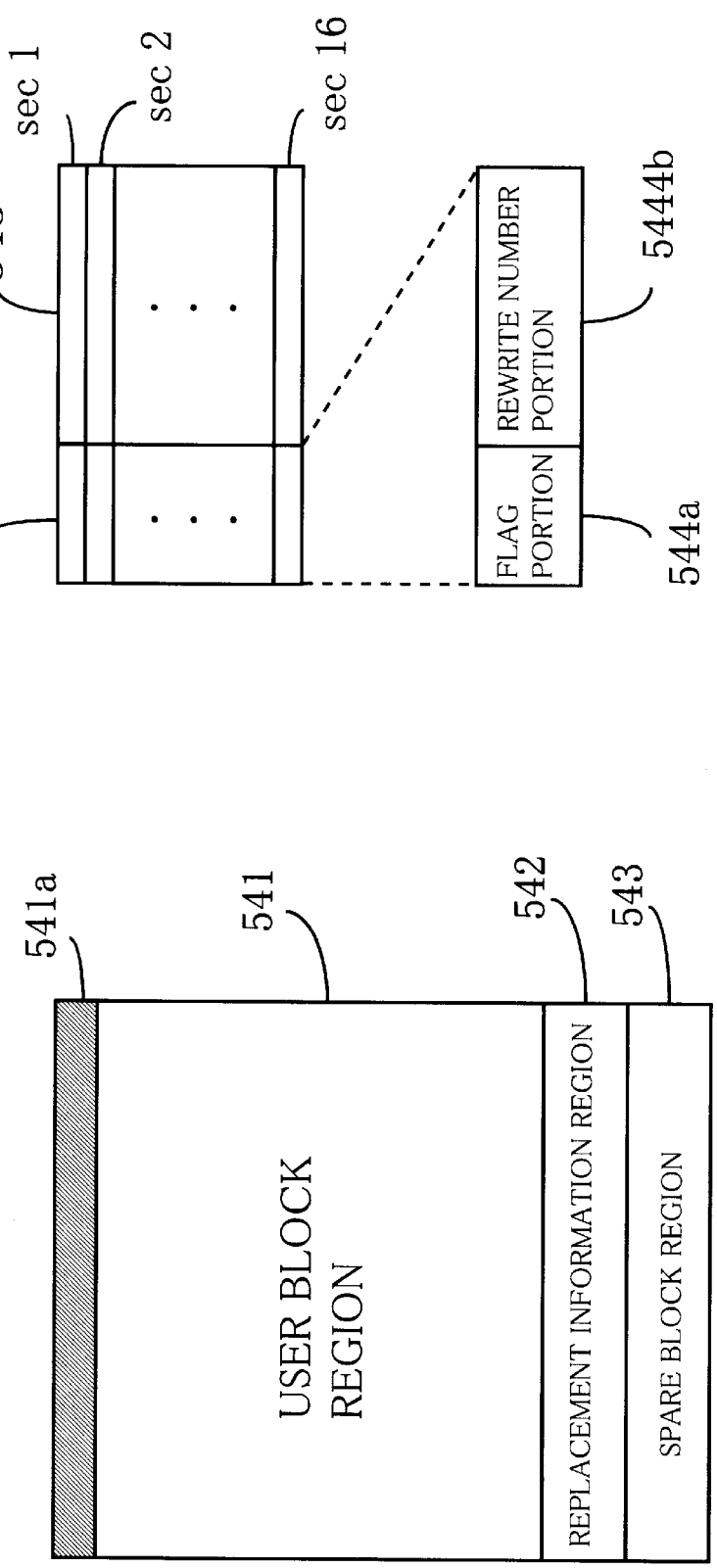
FIG. 2 is a block diagram showing an image of regions of the EEPROM shown in FIG. 1.
FIG. 3 is a block diagram showing an image of one block in the user block region of the EEPROM shown in FIG. 1.

FIG. 2 shows an image of regions of the EEPROM 540. The EEPROM 540 includes a user block region 541 storing user data accessed from or to a host computer, a spare block region 543 having a spare block storing data of a defective block of the user block region 541, and a replacement information region 542 storing information about an address of the spare block corresponding to the defective block where the defective block is present.

FIG. 3 shows an image of one block 541a in the user block region 541 of the EEPROM 540. The block 541a has a number of sectors, for example, 16 sectors. Each of the sectors includes a header portion 544 and a data portion 545. The header portion 544 has a flag portion 544a storing a code indicating a validity of the sector and a rewrite number portion 544b for storing information about a number of rewriting. The data portion 545 stores data accessed from a host computer. The blocks in the spare block region 543 have a configuration similar to that of the block 541a.

FIG. 4 shows an image of the replacement information region 542 of the EEPROM 540. The replacement information region 542 is divided into the storing portions corresponding to the blocks of the user block region 541. Each storing portion stores spare address information 542a, 542b, 542c, . . . , respectively. The spare address information indicates which block within the spare block region 543 is used to replace where there is a defected block in the user block region 541.

The data stored in the EEPROM 540 are read out to the host computer 550, and the data from the host computer 550 are stored into the EEPROM 540 through the buffer memory 530 and the host interface 510. The buffer memory 530 and the host interface 510 are controlled by the micro-controller 520. The header controller 160 controls the header portions of the blocks of the EEPROM 540. The header controller is controlled by the micro-controller 520.

The operation of writing data into the block 541a of the EEPROM 540 in the solid state disk system 100 from the host computer 550 will be explained as follows.

All data stored in the block 541a of the user block region 541 are read out and temporally stored in the buffer memory 530.

The data from the host computer 550 are also stored in the buffer memory 530. A data region of the buffer memory 530 for storing the data from the host computer 550 is distinct from a data region for storing the data of the block 541a.

The micro-controller 520 analyzes the information of the header portion 544 of the block 541a stored in the buffer memory 530. The analysis of the micro-controller 520 includes (a) whether the sector is defective, which is decided from the information of the flag portion 544a, and (b) whether a number of rewriting exceeds the predetermined value, which is decided from the information of the rewrite number portion 544b.

The data stored in the block 541a are erased.

The temporally stored data from the host computer 550 in the buffer memory 550 are added to the temporally stored data of the block 541a in the buffer memory 530.

The added data stored in the buffer memory 530 are written into the block 541a.

Where the micro-controller 520 determines from the information of the flag portion 544a of the block for writing that the sector of the block for writing data is defective, a replacement procedure is conducted. In the replacement procedure, the spare address information 542a is written into the predetermined portion within the replacement information region 542. The data from the host computer 550 are stored in the predetermined portion where the spare address information is directed.

Where an error has occurred in the header portion 544 of the block 541a, a normal accessing cannot be performed. Therefore, the header controller writes the same information about defect information of the block in header portions 544 in each sector of the block 541a. Even if an error has occurred in one header portion, all header portions of sectors within the block would not be defective. Therefore, if the data stored in the data portions 545 are correctly accessed after the same information was written in the header portions 544, it is recognized that only the data of the header portion 544 is defective. In this case, the recognized block can still be used with correction of the defective header portion.

In the above explanation, the header controller 160 is independent from the micro-controller 520. However, the micro-controller 520 can operate as the header controller 160 if the micro-controller 520 has a program of a header control operation.

Figure 5:
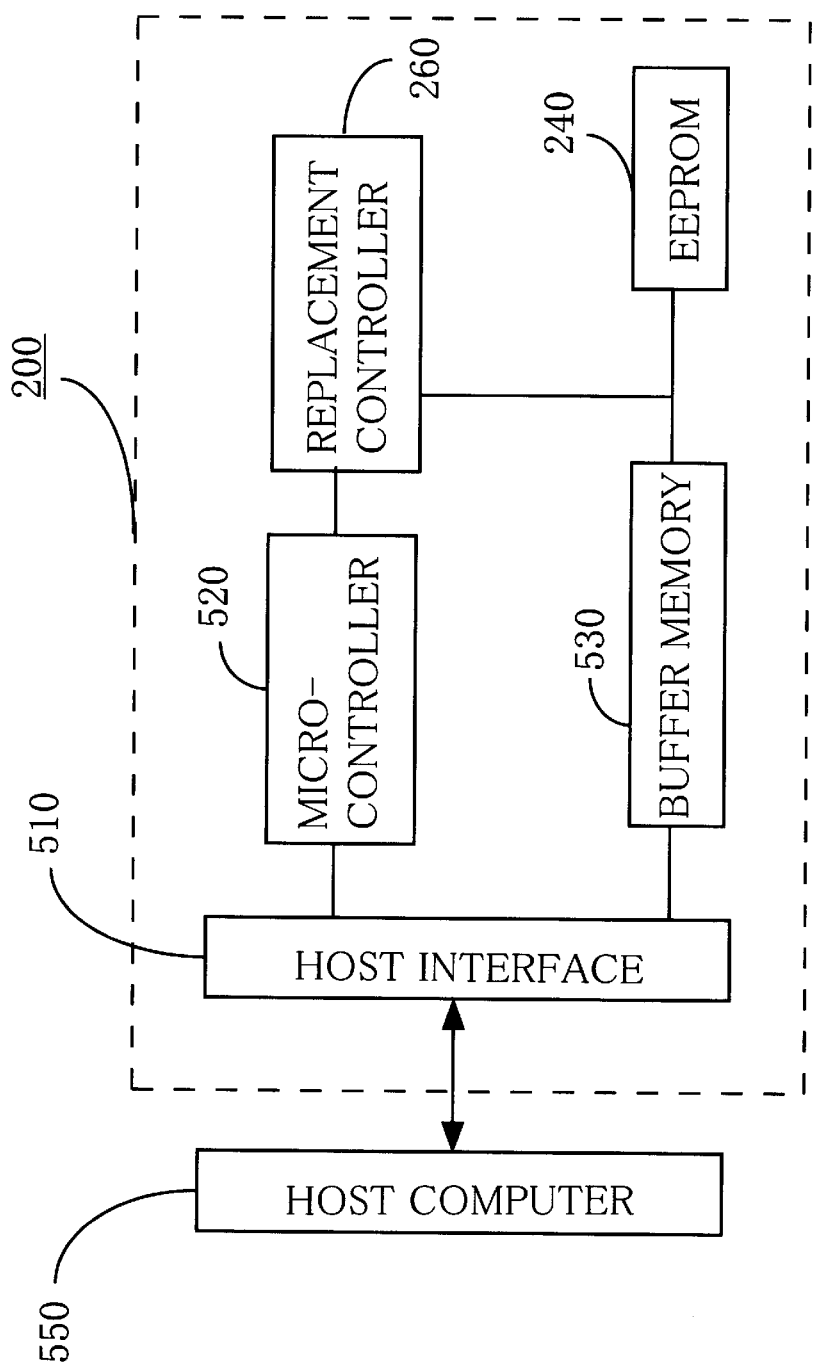
FIG. 5 is a block diagram showing a solid state disk system according to a second embodiment of the present invention.

FIG. 5 shows a solid state disk system 200 according to the second embodiment of the present invention. The solid state disk system 200 has a host interface 510 for inputting data from and outputting data to a host computer 550 which is located outside of the solid state disk system 200 and a micro-controller 520 for checking a defective block and conducting a replacement treatment and a replacement treatment control, which will be discussed below. The solid state disk system 200 further includes a buffer memory 530 for temporally storing data and an EEPROM 240 divided into blocks, each of which is erased at the same time. The solid state disk system 200 has a replacement controller 260 coupled to the micro-controller 520 and EEPROM 240.

The EEPROM 240 is comprised of a number of EEPROM chips. Each EEPROM chip includes an user block region 541 storing user data accessed from or to a host computer, a spare block region 543 having a spare block storing data of the defective block of the user block region 541, which is of the same configuration as described in the first embodiment. Each EEPROM chip further includes a replacement information region 242, shown in FIG. 6, storing information about an address of the spare block corresponding to the defective block where the defective block is present and information about a chip number of the EEPROM chip where a spare block is located.

FIG. 6 shows an image of the replacement information region 242. The replacement information region 242 is divided into the storing portions corresponding to the blocks of the user block region 541. Each storing portion stores chip number information 247a, 247b, . . . , and spare address information 242a, 242b, . . . , respectively. The spare address information is the same one explained in the first embodiment. The chip number information indicates the EEPROM chip number where the spare block is located.

The replacement controller 260 controls read/write of the replacement information region 242. The host interface 510, the micro-controller 520, the buffer memory 530 and the host computer 550 are the same as in the first embodiment.

The operation of writing data into the block 541a of the EEPROM 240 in the solid state disk system 200 from the host computer 550 has the same steps as described in the first embodiment. Therefore, the explanation will be omitted.

In a case where the data from the host computer 550 are written into the block 541a of one EEPROM chip of the EEPROM 240, the micro-controller 520 reads the data stored in header portion 544 of the block 541a. If the micro-controller 520 determines that the block 541a is defective, the data from the host computer 550 are written into the spare block region of the same EEPROM chip of the EEPROM 240.

If there is no space in the spare block region the same EEPROM chip, the host computer cannot access the EEPROM of the conventional solid state disk system. However, the replacement information region 242 of the solid state disk system according to the second embodiment of the present invention stores the chip number of the EEPROM chip as well as the address of the spare block corresponding to the defective block, as described in FIG. 6. Therefore, if there is no space in the spare block region 543 of one EEPROM chip having a defective block in the user block region 541, the replacement controller 260 assigns the spare block region 543 of another EEPROM chip for the defective block of the first EEPROM chip.

In the above explanation, the replacement controller 260 is independent from the micro-controller 520. However, the micro-controller 520 can operate as the replacement controller 260 if the micro-controller 520 has a program of a replacement control operation.

Figure 7:
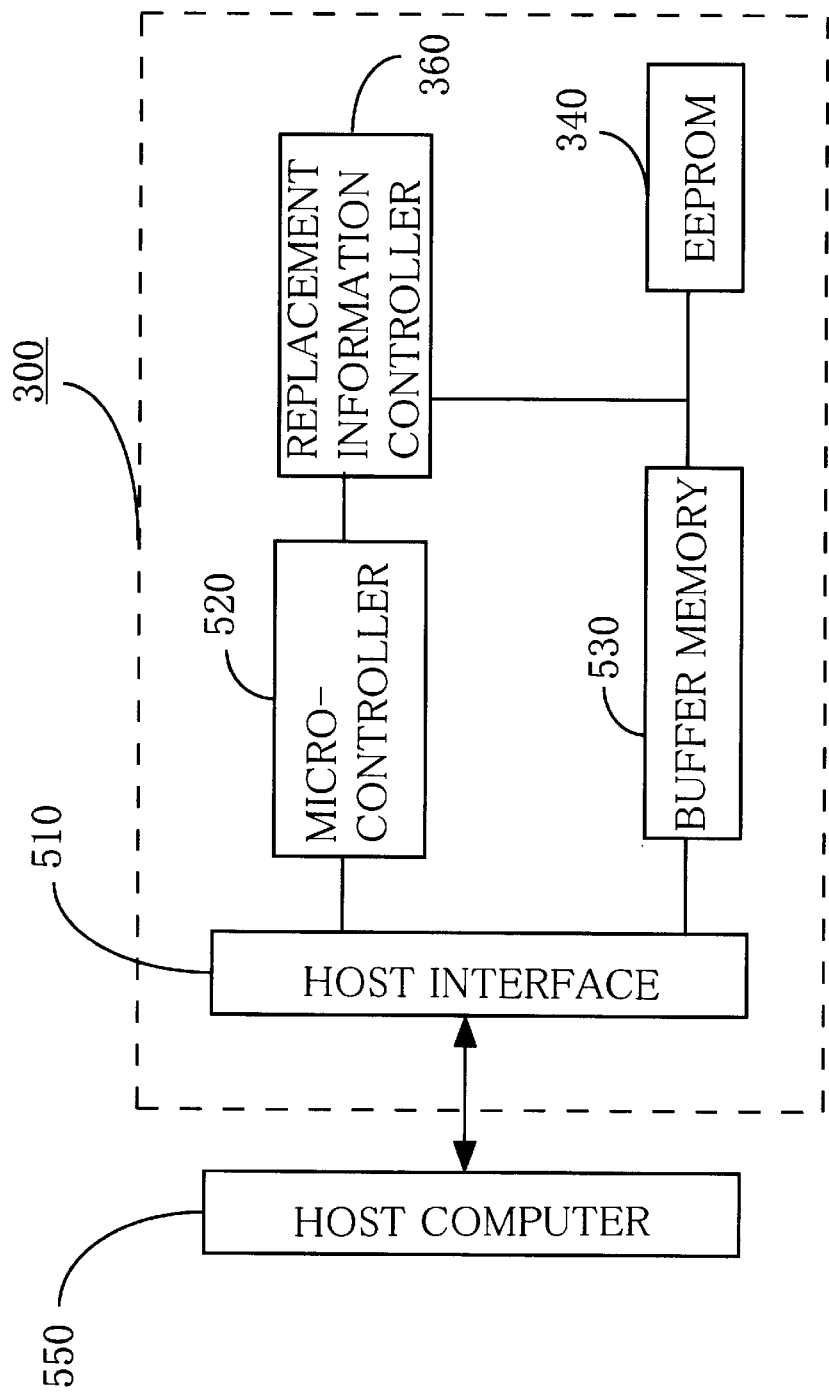
FIG. 7 is a block diagram showing a solid state disk system according to a third embodiment of the present invention.

FIG. 7 shows a solid state disk system 300 according to a third embodiment of the present invention. The solid state disk system 300 has a host interface 510 for inputting data from and outputting data to a host computer 550 which is located outside of the solid state disk system 300 and a micro-controller 520 for checking a defective block and conducting a replacement treatment and a replacement treatment control, which will be discussed below. The solid state disk system 300 further includes a buffer memory 530 for temporally storing data and an EEPROM 340 divided into blocks, each of which is erased at the same time. The solid state disk system 300 has a replacement information controller 360 coupled to the micro-controller 520 and EEPROM 340.

The EEPROM 340 includes a user block region 541 storing user data accessed from or to a host computer, a spare block region 543 having a spare block storing data of the defective block of the user block region 541, which is of the same configuration as described in the first embodiment. Further, the EEPROM 340 includes a replacement information region storing two identical pieces of information about an address of the spare block corresponding to the defective block where the defective block is present. Since the replacement information region should have more space compared with the replacement information region 542 of the first embodiment, a part of the user block region or spare block region of the third embodiment will be assigned as the replacement information region.

The replacement information controller 360 controls read/write of the replacement information region. The host interface 510, the micro-controller 520, the buffer memory 530 and the host computer 550 are the same as in the first embodiment.

The operation of writing data into the block 541a of the EEPROM 340 in the solid state disk system 300 from the host computer 550 has the same steps as described in the first embodiment. Therefore, the explanation will be omitted.

If the replacement information region of the conventional solid state disk system has an error, the host computer cannot access the solid state disk system. However, the replacement information region of the solid state disk system 300 according to the third embodiment of the present invention stores two identical pieces of replacement information. Therefore, even if one replacement information has an error, the other replacement information can be used.

In the above explanation, the replacement information controller 360 is independent from the micro-controller 520. However, the micro-controller 520 can operate as the replacement information controller 360 if the micro-controller 520 has a program of a replacement information operation.

Figure 8:
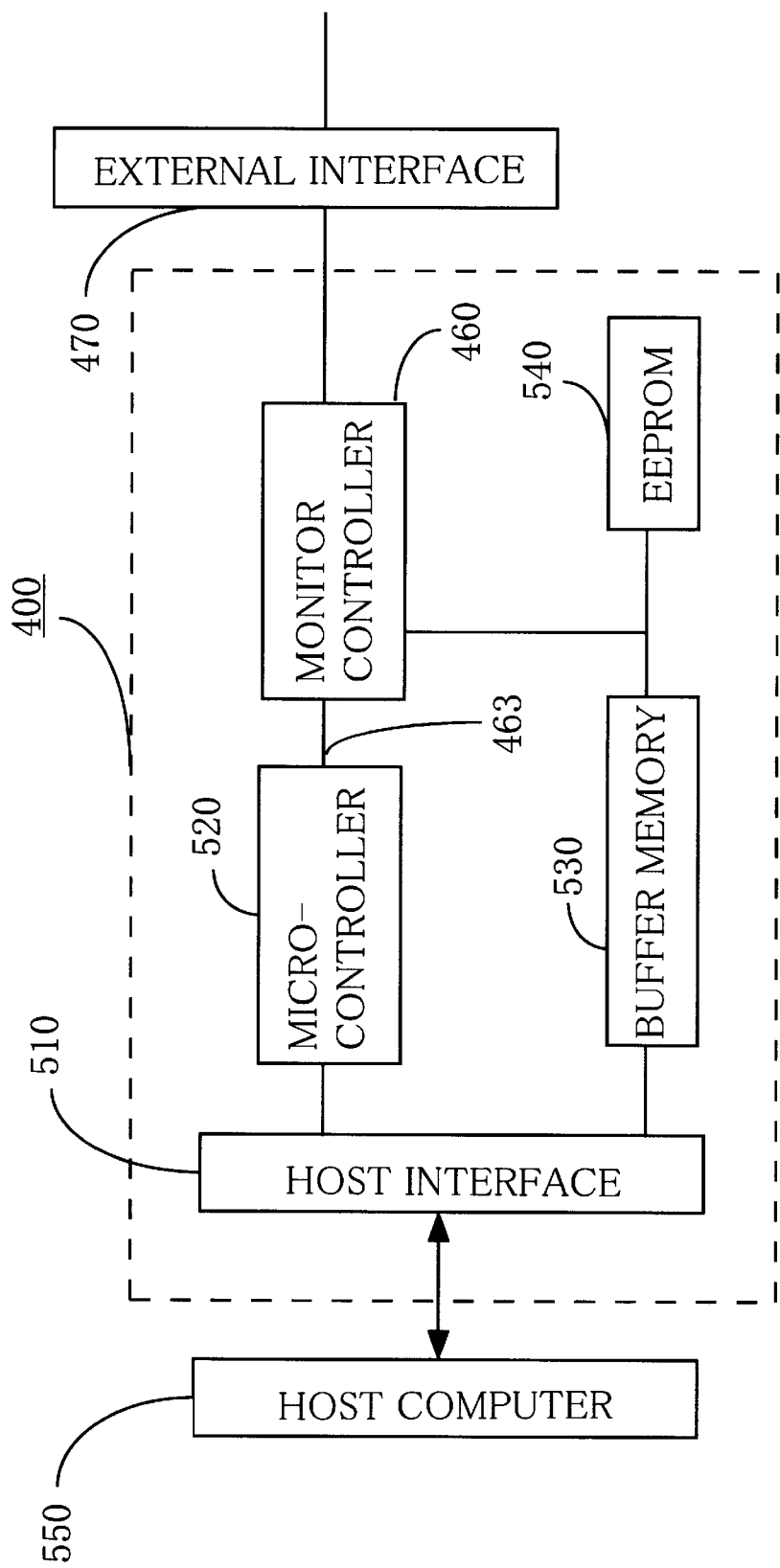
FIG. 8 is a block diagram showing a solid state disk system according to a fourth embodiment of the present invention.

FIG. 8 shows a solid state disk system 400 according to a fourth embodiment of the present invention. The solid state disk system 400 has a host interface 510 for inputting data from and outputting data to a host computer 550 which is located outside of the solid state disk system 400 and a micro-controller 520 for checking a defective block and conducting a replacement treatment and a replacement treatment control, which will be discussed below. The solid state disk system 400 further includes a buffer memory 530 for temporally storing data and an EEPROM 540 divided into blocks, each of which is erased at the same time. The solid state disk system 400 has a monitor controller 360 coupled to the micro-controller 520, EEPROM 340 and an external interface 470 which is located outside of the solid state disk system 400. The host interface 510, the micro-controller 520, the buffer memory 530, EEPROM 540 and the host computer 550 are the same as in the first embodiment. Therefore, the explanation is omitted.

Figure 9:
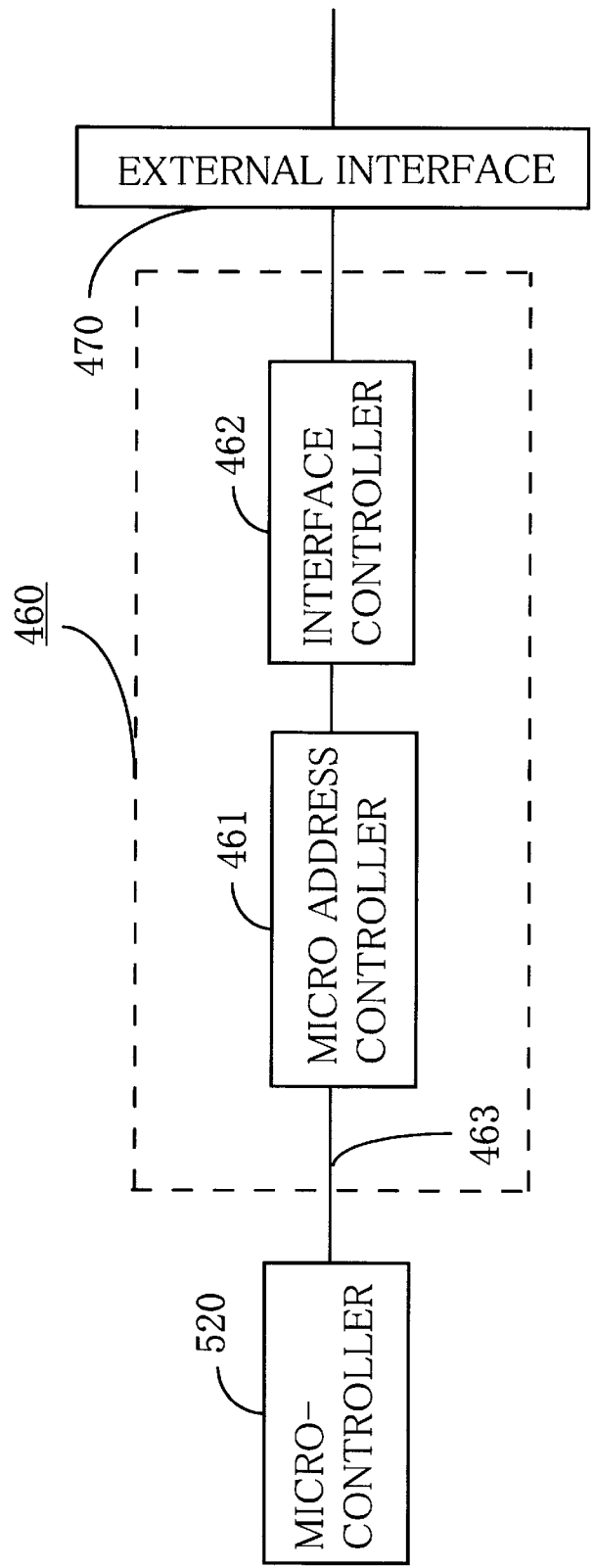
FIG. 9 is a block diagram showing the monitor controller shown in FIG. 8.

FIG. 9 is a block diagram showing the monitor controller 460. The monitor controller 460 is coupled to the micro-controller 520 through a micro address bus 463. The monitor controller 460 has a micro address detector 461 for detecting an address of the micro-controller 520 and an interface controller 462 for controlling the external interface which is located outside of the solid state disk system 400. The micro address detector 461 detects a micro address from data on a bus of the micro-controller. For example, the micro address detector 461 easily detects the micro address only if the micro detector 461 latches data on the micro bus in response to an address latch enable signal.

Since a micro processor in the micro-controller 520 operates by instructions of firmware, it is easily found from the micro address which step is conducted within the firmware in the micro-processor. Therefore, the operation of the micro-controller 520 can be monitored from the outside of the solid state disk system. The defective or error portion can be easily determined from the monitoring of the micro-controller 520.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A solid state disk system comprising:

a host interface for inputting data from and outputting data to a host computer located outside of said solid state disk system;

a buffer memory coupled to said host interface for temporally storing data;

an EEPROM coupled to said buffer memory, said EEPROM having a memory region divided into a plurality of blocks, each of which is erased at the same time, each of the memory blocks having a plurality of sectors, each having a header portion and a data portion, the memory region having a user block region storing data accessed from the host computer, a spare block region storing data for replacing any defective block within the user block region, and a replacement information region storing information about an address of a spare block corresponding to the defective block;

a micro-controller coupled to said host interface and buffer memory for controlling a replacement procedure; and a header controller coupled to said micro-controller and EEPROM for writing a same information into the header portions within the same memory block.

2. A solid state disk system according to claim 1, wherein the header portion has a flag portion storing a code indicating a validity of the sector and a rewrite number portion for storing information about a number of rewriting.

3. A solid state disk system according to claim 2, wherein said header controller writes the same information to the flag portions of the blocks.

4. A solid state disk system comprising:

a host interface for inputting data from and outputting data to a host computer located outside of said solid state disk system;

a buffer memory coupled to said host interface for temporally storing data;

an EEPROM coupled to said buffer memory, said EEPROM including a plurality of EEPROM chips and having a memory region divided into a plurality of blocks, each of which is erased at the same time, the memory region having a user block region storing data accessed from the host computer, a spare block region storing data for replacing any defective block within the user block region, and a replacement information region storing information about an address of a spare block corresponding to the defective block and information about the EEPROM chips;

a micro-controller coupled to said host interface and buffer memory for controlling a replacement procedure; and a replacement controller coupled to said micro-controller and EEPROM for searching an available spare block region in the other EEPROM chips when one of the EEPROM chips has no available spare block region.

5. A solid state disk system according to claim 4, wherein the block in the user block region has a plurality of sectors, each having a header portion and a data portion.

6. A solid state disk system according to claim 5, wherein the header portion has a flag portion storing a code indicating a validity of the sector and a rewrite number portion for storing information about a number of rewriting.

7. A solid state disk system comprising:

a host interface for inputting data from and outputting data to a host computer located outside of said solid state disk system;

a buffer memory coupled to said host interface for temporally storing data;

an EEPROM coupled to said buffer memory, said EEPROM including a plurality of EEPROM chips and having a memory region divided into a plurality of blocks, each of which is erased at the same time, the memory region having a user block region storing data accessed from the host computer, a spare block region storing data for replacing any defective block within the user block region, and a replacement information region storing information about an address of a spare block corresponding to the defective block;

a micro-controller coupled to said host interface and buffer memory for controlling a replacement procedure; and a replacement information controller coupled to said micro-controller and EEPROM for writing two identical pieces of replacement information into the replacement information region of the EEPROM.

8. A solid state disk system according to claim 7, wherein the block in the user block region has a plurality of sectors, each having a header portion and a data portion.

9. A solid state disk system according to claim 8, wherein the header portion has a flag portion storing a code indicating a validity of the sector and a rewrite number portion for storing information about a number of rewriting.

10. A solid state disk system comprising:

a host interface for inputting data from and outputting data to a host computer located outside of said solid state disk system;

a buffer memory coupled to said host interface for temporally storing data;

an EEPROM coupled to said buffer memory, said EEPROM including a plurality of EEPROM chips and having a memory region divided into a plurality of blocks, each of which is erased at the same time, the memory region having a user block region storing data accessed from the host computer, a spare block region storing data for replacing any defective block within the user block region, and a replacement information region storing information about an address of a spare block corresponding to the defective block;

a micro-controller coupled to said host interface and buffer memory for controlling a replacement procedure; and a monitor controller coupled to said micro-controller, EEPROM and an external interface outside of said solid state disk system for detecting an address within said micro-controller and outputting the detected address to the external interface.

11. A solid state disk system according to claim 10, wherein said monitor controller comprises a micro address detector for detecting an address of the micro-controller and an interface controller for controlling the external interface.

12. A solid state disk system according to claim 10, wherein the block in the user block region has a plurality of sectors, each having a header portion and a data portion.

13. A solid state disk system according to claim 12, wherein the header portion has a flag portion storing a code indicating a validity of the sector and a rewrite number portion for storing information about a number of rewriting.

* * * * *